US011231456B2

(12) United States Patent
So et al.

(10) Patent No.: US 11,231,456 B2
(45) Date of Patent: Jan. 25, 2022

(54) HANDLER

(71) Applicant: Synax Co., Ltd., Matsumoto (JP)

(72) Inventors: Vincent So, San Francisco, CA (US);
Takamitsu Aihara, Koriyama (JP);
Tomohisa Maruyama, Matsumoto (JP)

(73) Assignee: Synax Co., Ltd.

( * ) Notice: Subject to any disclaimer, the term of this patent is extended or adjusted under 35 U.S.C. 154(b) by 0 days.

(21) Appl. No.: 17/072,155

(22) Filed: Oct. 16, 2020

(65) Prior Publication Data

US 2021/0148971 A1 May 20, 2021

Related U.S. Application Data

(63) Continuation of application No. PCT/JP2019/038658, filed on Sep. 30, 2019.

(30) Foreign Application Priority Data

Dec. 21, 2018 (JP) .............................. JP2018-239895

(51) Int. Cl.
*G01R 31/26* (2020.01)
*G01R 31/28* (2006.01)
(Continued)

(52) U.S. Cl.
CPC .......... *G01R 31/2893* (2013.01); *B25J 18/00* (2013.01)

(58) Field of Classification Search
CPC ........ G01R 31/02; G01R 31/26; G01R 31/28; G01R 31/2851; G01R 31/2887;
(Continued)

(56) References Cited

U.S. PATENT DOCUMENTS 5,631,573 A * 5/1997 Ohno .................. G01R 1/0433
324/754.07
2004/0216536 A1 11/2004 Park
(Continued)

FOREIGN PATENT DOCUMENTS

JP     H02-128575 U    10/1990
JP     2000-147053 A    5/2000
(Continued)

OTHER PUBLICATIONS

U.S. Appl. No. 17/073,447, filed Oct. 19, 2020, Vincent So et al.
(Continued)

*Primary Examiner* — Neel D Shah
(74) *Attorney, Agent, or Firm* — Harness, Dickey & Pierce, P.L.C.

(57) ABSTRACT

A handler has a processing unit, first and second driving units, a holding unit and a crank unit. The processing unit processes a device provided in a placement area. The first driving unit moves the processing unit along a movement path. The holding unit holds the device and is attached to the crank unit. The second driving unit moves the holding unit. The crank unit comprises a first portion to which the holding unit is attached and a second portion connected to the first portion. The handler is allowed to be in a first posture for causing the holding unit to be located inside the movement path and to be in a second posture for causing the processing unit to be located in vicinity of the device.

7 Claims, 8 Drawing Sheets

(51) Int. Cl.
  *G01R 1/04* (2006.01)
  *G01R 1/067* (2006.01)
  *G01R 1/073* (2006.01)
  *H01L 21/67* (2006.01)
  *B25J 18/00* (2006.01)

(58) Field of Classification Search
  CPC ............ G01R 31/2893; G01R 31/0433; G01R 31/067; G01R 31/073; H01L 21/67; H01L 21/673; H01L 21/687
  See application file for complete search history.

(56) References Cited

U.S. PATENT DOCUMENTS

| | | | |
|---|---|---|---|
| 2006/0057875 A1 | 3/2006 | Eldridge et al. | |
| 2009/0051381 A1 | 2/2009 | Hosoda et al. | |
| 2010/0129940 A1 | 5/2010 | Little | |
| 2011/0004343 A1 | 1/2011 | Iida | |
| 2014/0088762 A1* | 3/2014 | Iida | B25J 9/1694 700/253 |
| 2019/0072605 A1 | 3/2019 | Natsuizaka | |

FOREIGN PATENT DOCUMENTS

| | | |
|---|---|---|
| JP | 2002-207061 A | 7/2002 |
| JP | 2005-514596 A | 5/2005 |
| JP | 2011-011318 A | 1/2011 |
| JP | 2015-062994 A | 4/2015 |
| JP | 2016-164981 A | 9/2016 |
| JP | 2018-160592 A | 10/2018 |
| KR | 2011-0135382 A | 12/2011 |
| WO | WO-2007-023557 A1 | 3/2007 |
| WO | WO-2008-114457 A1 | 9/2008 |
| WO | WO-2010-007653 A1 | 1/2010 |
| WO | WO-2007-145495 A1 | 8/2017 |
| WO | WO-2018-056021 A1 | 3/2018 |

OTHER PUBLICATIONS

International Search Report for Application No. PCT/JP2019/038659 dated Nov. 12, 2019 with Written Opinion (9 Pages).
International Search Report for Application No. PCT/JP2019/038658 dated Nov. 26, 2019 with Written Opinion (12 Pages).

* cited by examiner

HANDLER

CROSS-REFERENCE TO RELATED APPLICATIONS

This application is a Continuation Application of PCT Application No. PCT/JP2019/038658, filed Sep. 30, 2019 and based upon and claiming the benefit of priority from prior Japanese Patent Application No. 2018-239895, filed Dec. 21, 2018, the entire contents of all of which are incorporated herein by reference.

BACKGROUND OF THE INVENTION

1. Field of the Invention

The present invention relates to a handler.

2. Description of the Related Art

Conventionally, handlers which handle devices have been known. Handlers transfer devices (for example, electronic components) in a vertical direction, a horizontal direction, etc., and apply a process (for example, an electric property inspection) to the devices.

To prevent interference between the mechanism which transfers a device and the mechanism which processes the device, for example, the device may be moved to the vicinity of the mechanism which processes the device through a plurality of directions, or the device may be moved to the vicinity of the mechanism which processes the device via a sufficiently long distance. In this configuration, the structure of the handler becomes complex. Thus, the cost necessary to manufacture the handler may be increased.

BRIEF SUMMARY OF THE INVENTION

An aspect of the present invention is to provide a handler which can be simply structured.

According to one embodiment, a handler comprises a processing unit, a first driving unit, a holding unit, a crank unit and a second driving unit. The processing unit processes a device provided in a placement area. The first driving unit moves the processing unit along a movement path reaching the placement area. The holding unit is allowed to hold the device. The holding unit is attached to the crank unit. The second driving unit moves the holding unit so as to be inside the movement path via the crank unit. The crank unit comprises a first portion to which the holding unit is attached and which extends in a direction intersecting with a direction parallel to the movement path, and a second portion connected to the first portion and extending from a position connected to the first portion to a side separating from the placement area in the direction parallel to the movement path. The handler is allowed to be in a first posture and a second posture. The first posture is a posture for causing the holding unit to be located inside the movement path and causing the second portion to be located outside the movement path so as to face the processing unit. The second posture is a posture for causing the processing unit to be located in vicinity of the device provided in the placement area.

The present invention comprising the above structure can provide a handler which can be simply structured.

Additional aspects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
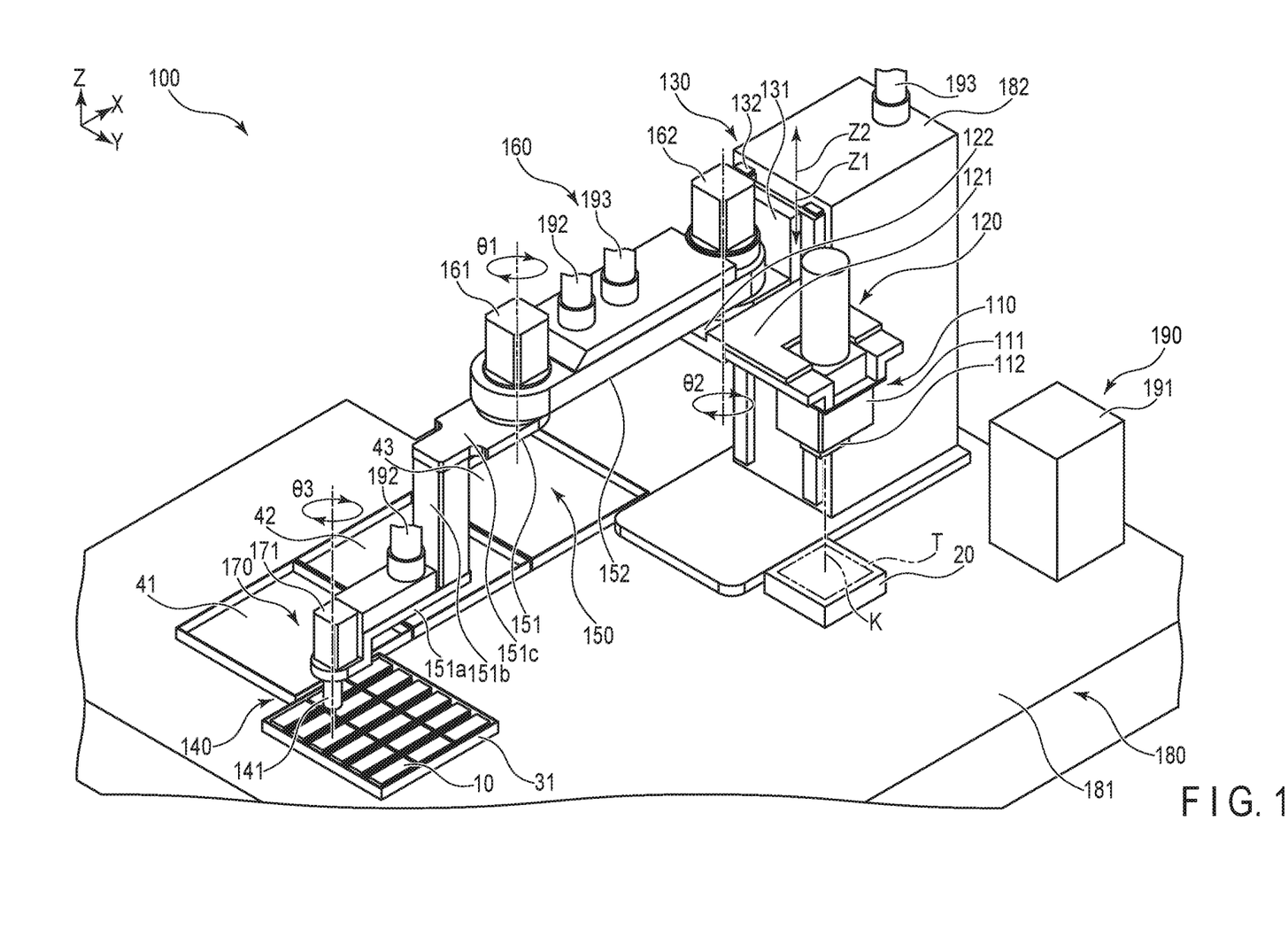
FIG. 1 is a perspective view showing an IC handler according to one embodiment.
Figure 2:
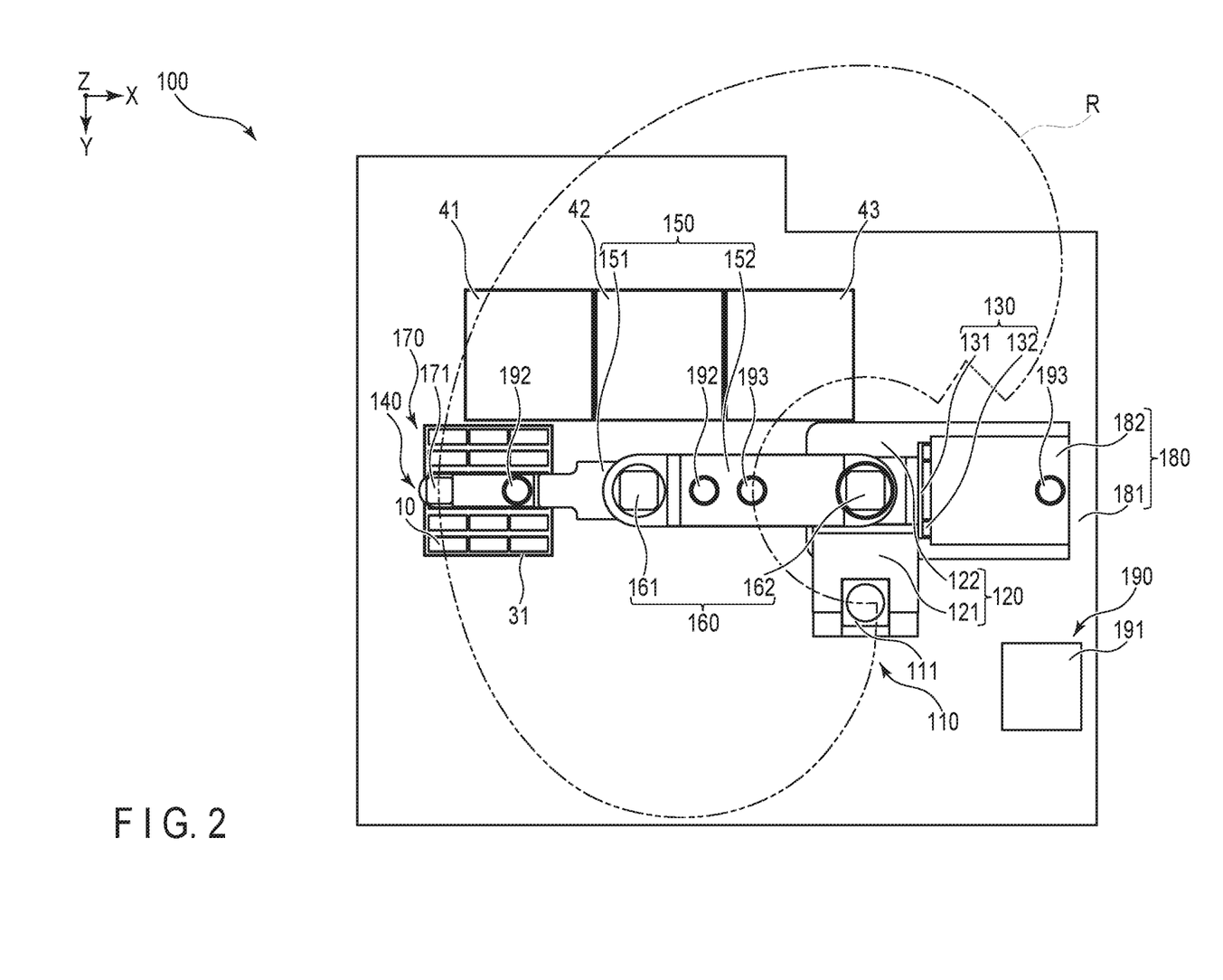
FIG. 2 is a top view showing the IC handler of FIG. 1.
Figure 3:
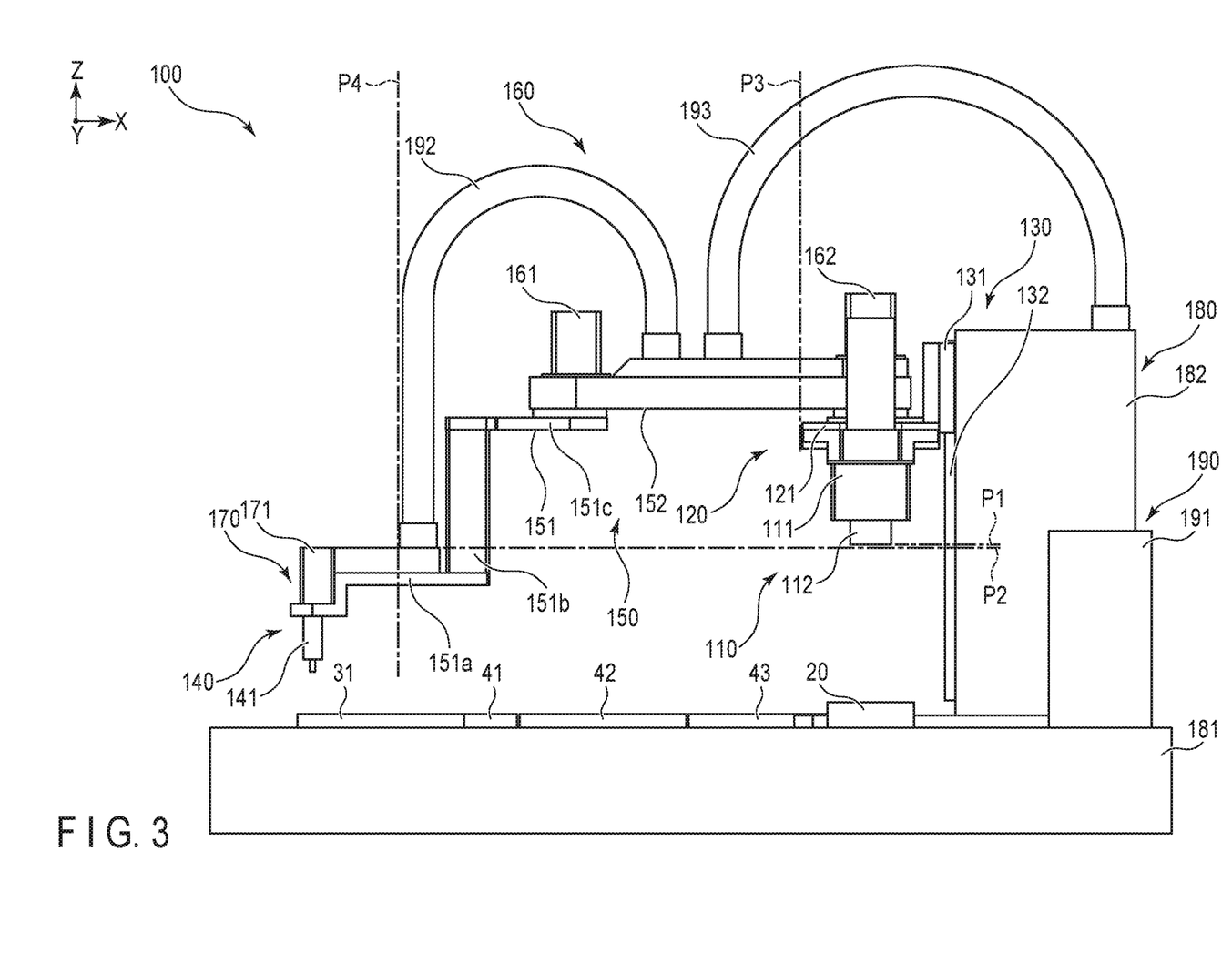
FIG. 3 is a front view showing the IC handler of FIG. 1.

Hereinafter, as an embodiment of the present invention, an IC handler 100 for processing an IC chip 10 is exemplarily shown. An example of the structure of the IC handler 100 is explained with reference to FIG. 1 to FIG. 3. FIG. 1 is a perspective view showing the IC handler 100 according to the embodiment. FIG. 2 is a top view showing the IC handler 100 of FIG. 1. FIG. 3 is a front view showing the IC handler 100 of FIG. 1. In the following explanation, a lateral width direction X, a depth direction Y and a perpendicular direction Z are defined as shown in the figures. For example, these directions X, Y and Z perpendicularly intersect one another.

The IC handler (handler) 100 comprises a contactor (processing unit) 110, a supporting unit 120, a first driving unit 130, a holding unit 140, a crank unit 150, a second driving unit 160, a third driving unit 170, a housing 180 and a control unit 190. The IC handler 100 is structured by combining the contactor 110 with a SCARA robot comprising the first driving unit 130, the second driving unit 160, etc.

The contactor 110 processes an IC chip 10 placed in a placement area T. The contactor 110 includes an inspection unit 111, a temperature adjustment unit 112, etc. The inspection unit 111 inputs a signal to the IC chip 10 via the temperature adjustment unit 112 or from the vicinity of the temperature adjustment unit 112 and inspects the electrical properties. The temperature adjustment unit 112 includes, for example, active thermal control (ATC). The temperature unit 112 comes in contact with the IC chip 10 and adjusts the temperature of the IC chip 10 in a predetermined temperature range. The predetermined temperature range is a temperature range from the upper limit temperature to the lower limit temperature in the specification of the IC chip 10.

The supporting unit 120 supports the contactor 110, etc. The supporting unit 120 includes a first supporting unit 121 and a second supporting unit 122. The first supporting unit 121 and the second supporting unit 122 are adjacent to each other in the depth direction Y and are integrally formed with each other while having a step in the perpendicular direction Z. The inspection unit 111 of the contactor 110 is attached to the first supporting unit 121. For example, a supporting stand 131 provided in the first driving unit 130 and a second motor 162 provided in the second driving unit 160 are attached to the second supporting unit 122.

The first driving unit 130 moves the contactor 110, etc., along a movement path K. The first driving unit 130 is attached to a side surface of a pillar 182 provided in the housing 180. The first driving unit 130 includes the supporting stand 131, a linear guide 132, etc. The second supporting unit 122 of the supporting unit 120 is attached to the supporting stand 131. The linear guide 132 includes a pair of rails and guides the supporting stand 131 in the perpendicular direction Z by a ball screw and a drive motor (not shown). A single-axial linear motion stage comprises the supporting stand 131, the linear guide 132, the ball screw and the drive motor. The first driving unit 130 moves the contactor 110, the holding unit 140, the crank unit 150, the second driving unit 160 and the third driving unit 170 to the lower side Z1 and the upper side Z2 of the perpendicular direction Z via the supporting unit 120.

The holding unit 140 holds an IC chip (device) 10. The holding unit 140 includes a pick up tip 141, etc. The pick up tip 141 comprises a pick up function, and picks up and holds an IC chip 10. The holding unit 140 may be structured by a robot hand which holds an IC chip 10, a hook-like member which hooks and holds an IC chip 10, an electromagnet which attracts an IC chip 10 by an electromagnetic force, etc.

The pick up tip 141 is attached to the crank unit 150. The crank unit 150 includes a first arm 151, a second arm 152, etc.

The first arm 151 is formed in a crank shape. The first arm 151 includes a first portion 151a, a second portion 151b and a third portion 151c. The pick up tip 141 is attached to the first portion 151a. The first portion 151a extends in a direction intersecting with a direction (perpendicular direction Z) parallel to the movement path K. The second portion 151b is connected to the first portion 151a. The second portion 151b extends from the position connected to the first portion 151a to a side separating from the placement area T in the perpendicular direction Z (in other words, extends to the upper side Z2 of the perpendicular direction Z). The third portion 151c is connected to the upper end of the second portion 151b. The third portion 151c extends in a direction intersecting with the perpendicular direction Z.

In the first arm 151, the pick up tip 141 is attached to an end of the first portion 151a, and the second portion 151b is attached to the other end. The angle made by the first portion 151a and the second portion 151b is, for example, perpendicular in the example shown in FIG. 3. However, the angle may be an acute angle or an obtuse angle.

The second arm 152 is connected to the third portion 151c of the first arm 151 via a first motor 161. The second arm 152 is formed in an elongated shape and extends in a direction intersecting with the perpendicular direction Z in a manner similar to that of the first arm 151.

The first arm 151 of the crank unit 150 has the following positional relationship with the contactor 110. As shown in FIG. 3, in the perpendicular direction Z, a first position P1, which is the position of the lower end of the contactor 110, is located on the upper side Z2 compared with a second position P2, which is the position of the upper end of the first portion 151a of the first arm 151. Here, the crank unit 150 and the contactor 110 are moved in the perpendicular direction Z in an integrated state by the first driving unit 130. Thus, even if the first arm 151 and the second arm 152 are rotated by the second driving unit 160, the interval between the first position P1 and the second position P2 in the perpendicular direction Z is constant. Further, as shown in FIG. 3, in the lateral width direction X, a third position P3 and a fourth position P4 have a positional relationship such that they do not interfere with each other even if the first arm 151 and the second arm 152 are rotated. For example, the third position P3 is a position equivalent to the end portion on the holding unit 140 side in FIG. 3 in a portion including the contactor 110 and the supporting unit 120 which supports the contactor 110. For example, the fourth position P4 is a position equivalent to the end portion of a control cable 192 to be described later on the holding unit 140 side.

The second driving unit 160 moves the pick up tip 141 so as to be inside the movement path K via the crank unit 150. The second driving unit 160 includes the first motor 161, the second motor 162, etc. For the first motor 161, for example, a servo motor may be used. The first motor 161 moves the pick up tip 141 in the lateral width direction X and the depth direction Y intersecting with the perpendicular direction Z by rotating (swiveling) the first arm 151 in rotational direction θ1 shown in FIG. 1 with respect to the second arm 152. The axis of rotation by the first motor 161, in other words, the rotor of the first motor 161, is parallel to, for example, the perpendicular direction Z.

For the second motor 162, for example, a servo motor may be used. The second motor 162 moves the pick up tip 141 in the lateral width direction X and the depth direction Y intersecting with the perpendicular direction Z by rotating (swiveling) the second arm 152 in rotational direction 62 shown in FIG. 1 with respect to the first driving unit 130. The axis of rotation by the second motor 162, in other words, the rotor of the second motor 162, is parallel to, for example, the perpendicular direction Z.

The pick up tip 141 is allowed to be moved in a movement range R as shown in FIG. 2 by the second driving unit 160. Specifically, the second driving unit 160 is allowed to cause the first arm 151 and the second arm 152 to extend in alignment or intersect each other while the first motor 161 and the second motor 162 cause the first arm 151 and the second arm 152 to coordinate. In this way, the second driving unit 160 is allowed to move the pick up tip 141 to an arbitrary coordinate position of a large part of the area (movement area R) of a placement table 181 in the lateral width direction X and the depth direction Y. The movement range R includes a socket 20 for attaching the IC chip 10 to be inspected. The movement range R includes a feed tray 31 in which an IC chip 10 before inspection is housed, an OK-device tray 41 in which an IC chip 10 after inspection is sorted out and housed, a reinspection-device tray 42 and an NG-device tray 43.

The third driving unit 170 rotates the pick up tip 141 in the lateral width direction X and the depth direction Y intersecting with the perpendicular direction Z. The third driving unit 170 includes a third motor 171, etc. For the third motor 171, for example, a servo motor may be used. The third motor 171 is attached to the first portion 151a of the first arm 151. The third motor 171 rotates (swivels) the pick up tip 141 in rotational direction Θ3 shown in FIG. 1. For example, the third motor 171 is used to attach the IC chip 10 held by the pick up tip 141 to the socket 20 in a predetermined direction. The third motor 171 is used to put the IC chip 10 held by the pick up tip 141 in the OK-device tray 41, the reinspection-device tray 42 and the NG-device tray 43 in a predetermined direction. The axis of rotation by the third motor 171, in other words, the rotor of the third motor 171, is parallel to, for example, the perpendicular direction Z.

The housing 180 supports the first driving unit 130, etc. Various trays for housing an IC chip 10 are placed in the housing 180. The housing 180 includes the placement table 181, the pillar 182, etc. For example, the socket 20 for attaching the IC chip 10 to be inspected and a controller 191 provided in the control unit 190 are provided in the placement table 181. The placement area T for an IC chip 10 is set on the upper surface of the socket 20. The movement path K of the contactor 110 is set in the perpendicular direction Z from the contactor 110 to the socket 20. The feed tray 31 is placed in the placement table 181. Similarly, the OK-device tray 41, the reinspection-device tray 42 and the NG-device tray 43 are placed in the placement table 181. The pillar 182 is provided in the placement table 181. The first driving unit 130 is attached to a side surface of the pillar 182.

The control unit 190 controls the contactor 110, the first driving unit 130, the holding unit 140, the second driving unit 160 and the third driving unit 170. The control unit 190 includes the controller 191, the first control cable 192, a second control cable 193, etc. The controller 191 includes a read-only memory (ROM), a central processing unit (CPU), a random-access memory (RAM), etc. The ROM stores a control program which controls the structural devices of the first driving unit 130, the holding unit 140, the second driving unit 160 and the third driving unit 170. The CPU executes the control program. The RAM temporarily stores various types of data while the CPU executes the control program.

The controller 191 is operated via, for example, a personal computer. The first control cable 192 is connected to the first arm 151 and the second arm 152. The first control cable 192 houses the power lines and communication lines of the pick up tip 141, the third motor 171, etc. The second control cable 193 is connected to the second arm 152 and the pillar 182. The second control cable 193 houses the power lines and communication lines for supplying power to the pick up tip 141, the first motor 161, the second motor 162, the third motor 171, etc.

Figure 4:
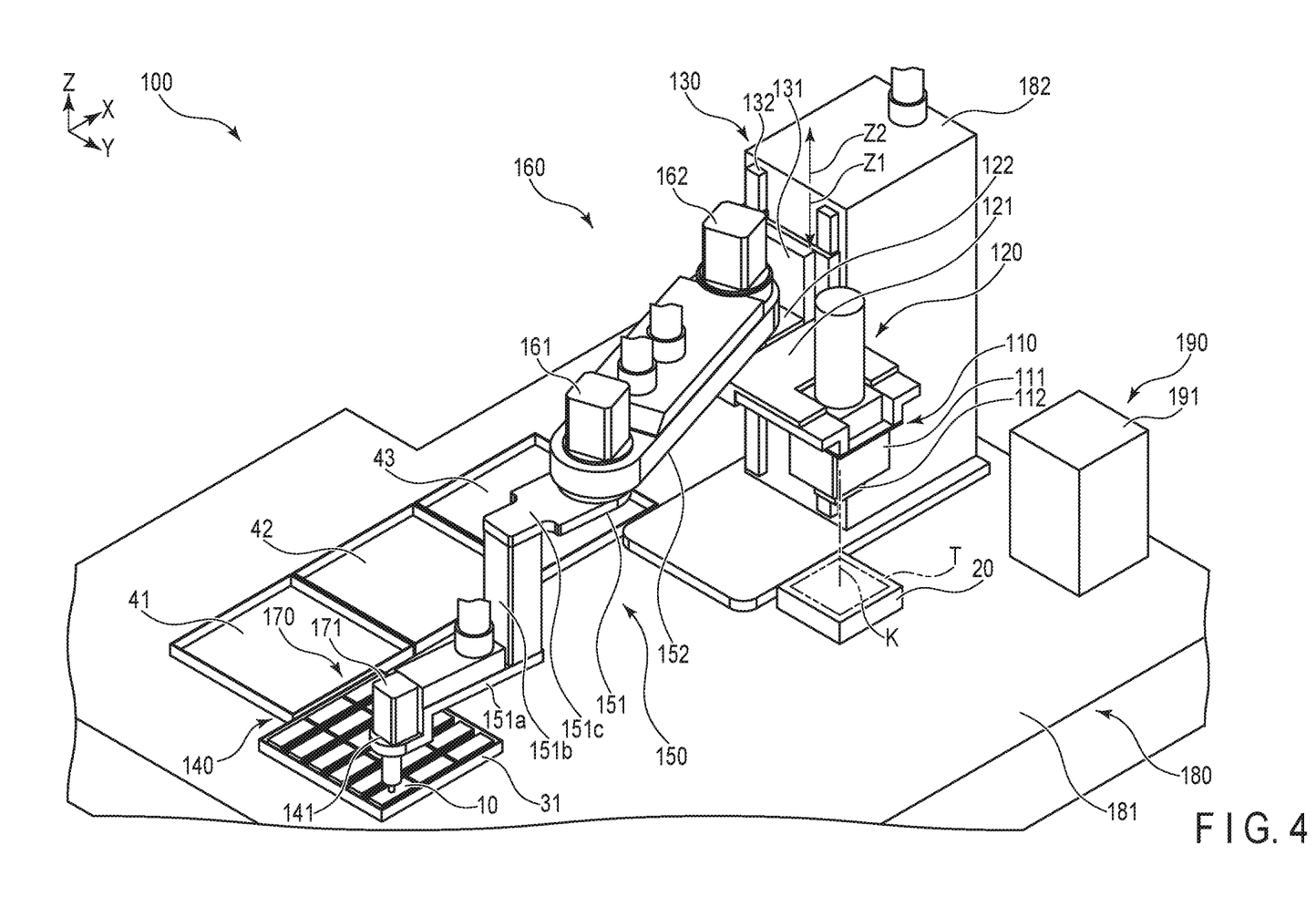
FIG. 4 is a perspective view showing the state in which an IC chip is taken out from a feed tray regarding the operation of the IC handler according to the embodiment.
Figure 5:
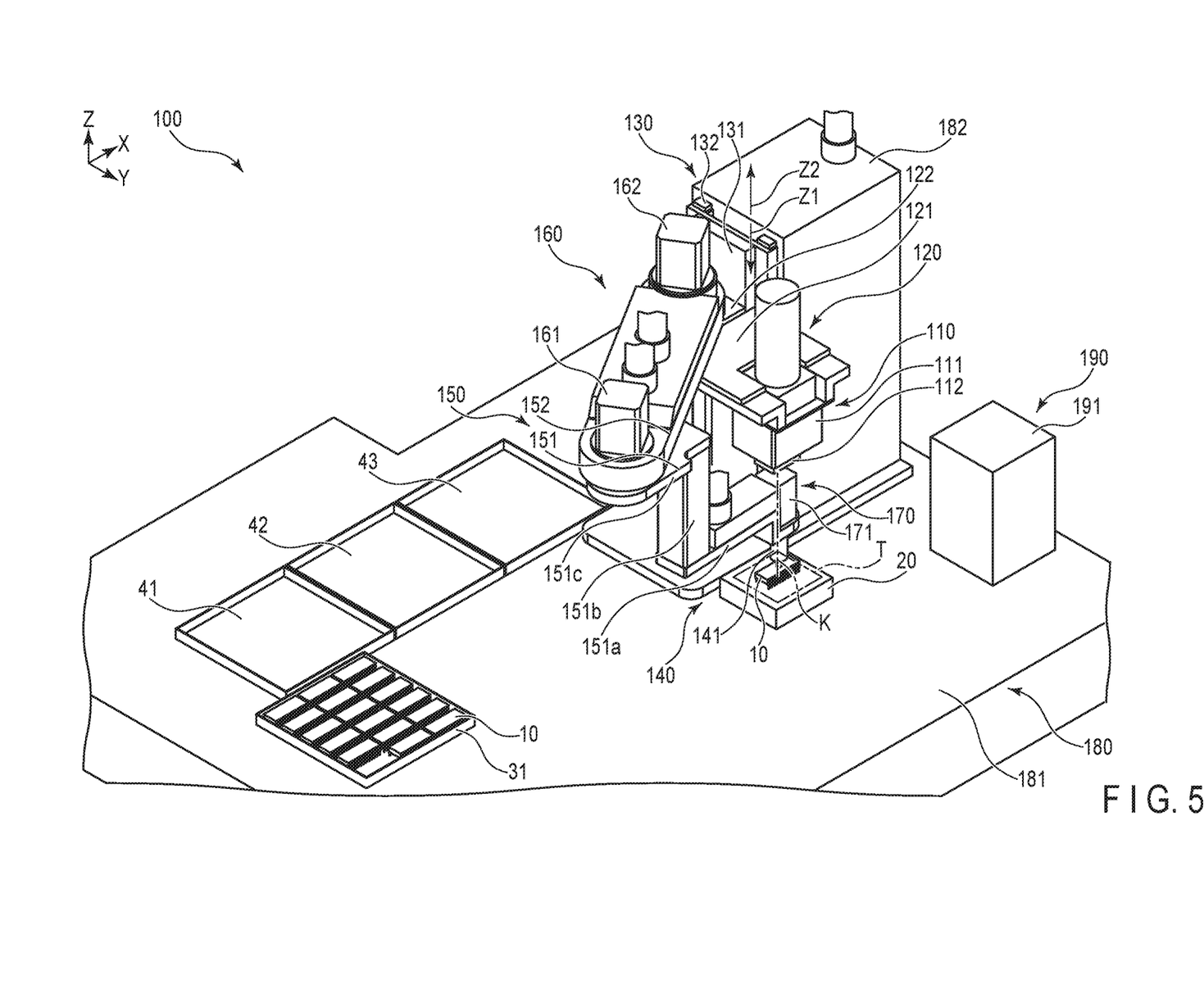
FIG. 5 is a perspective view showing the state in which the IC chip is placed in a socket subsequent to the state shown in FIG. 4.
Figure 6:
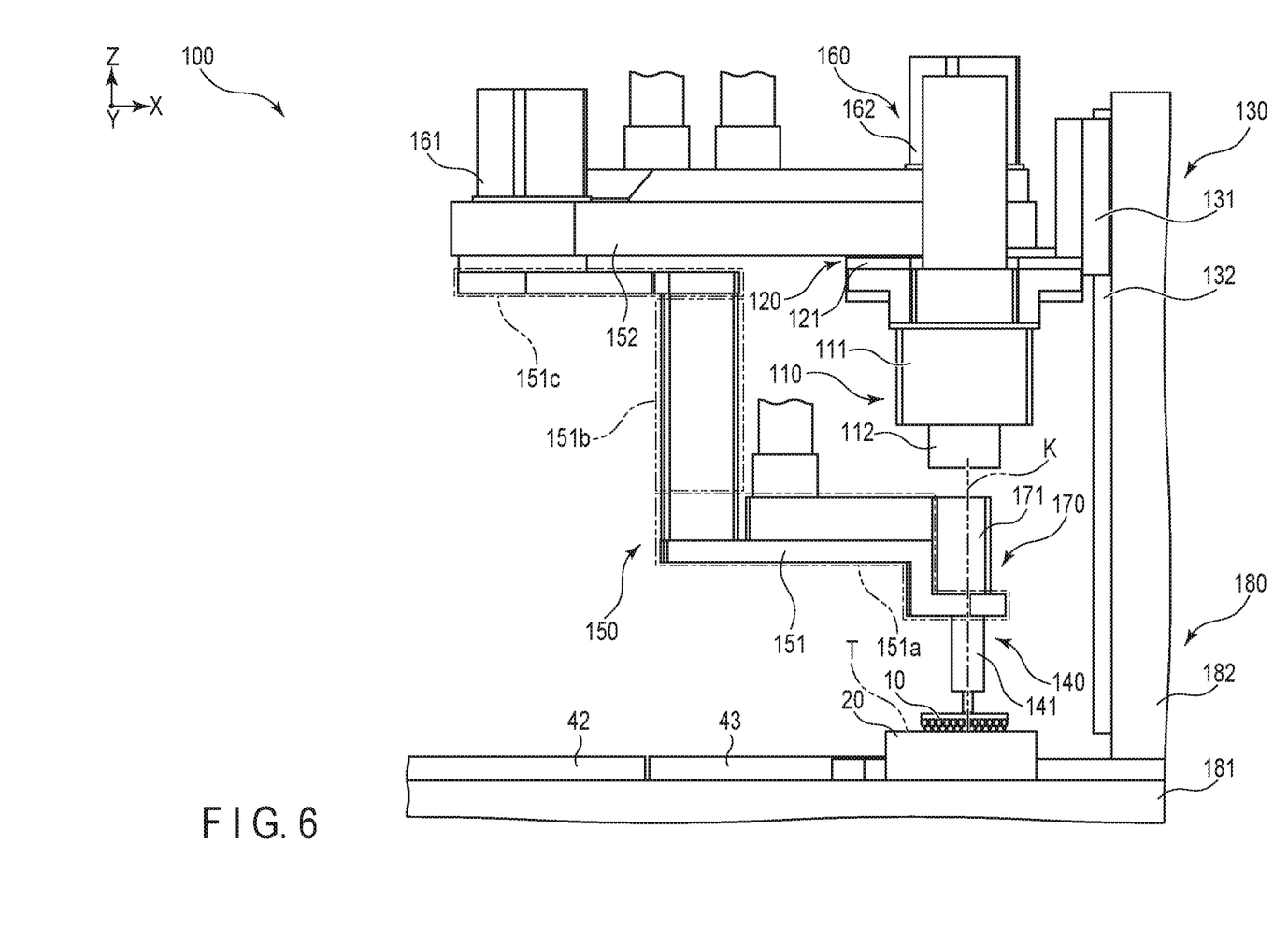
FIG. 6 is a front view showing the main part of the state of FIG. 5.
Figure 7:
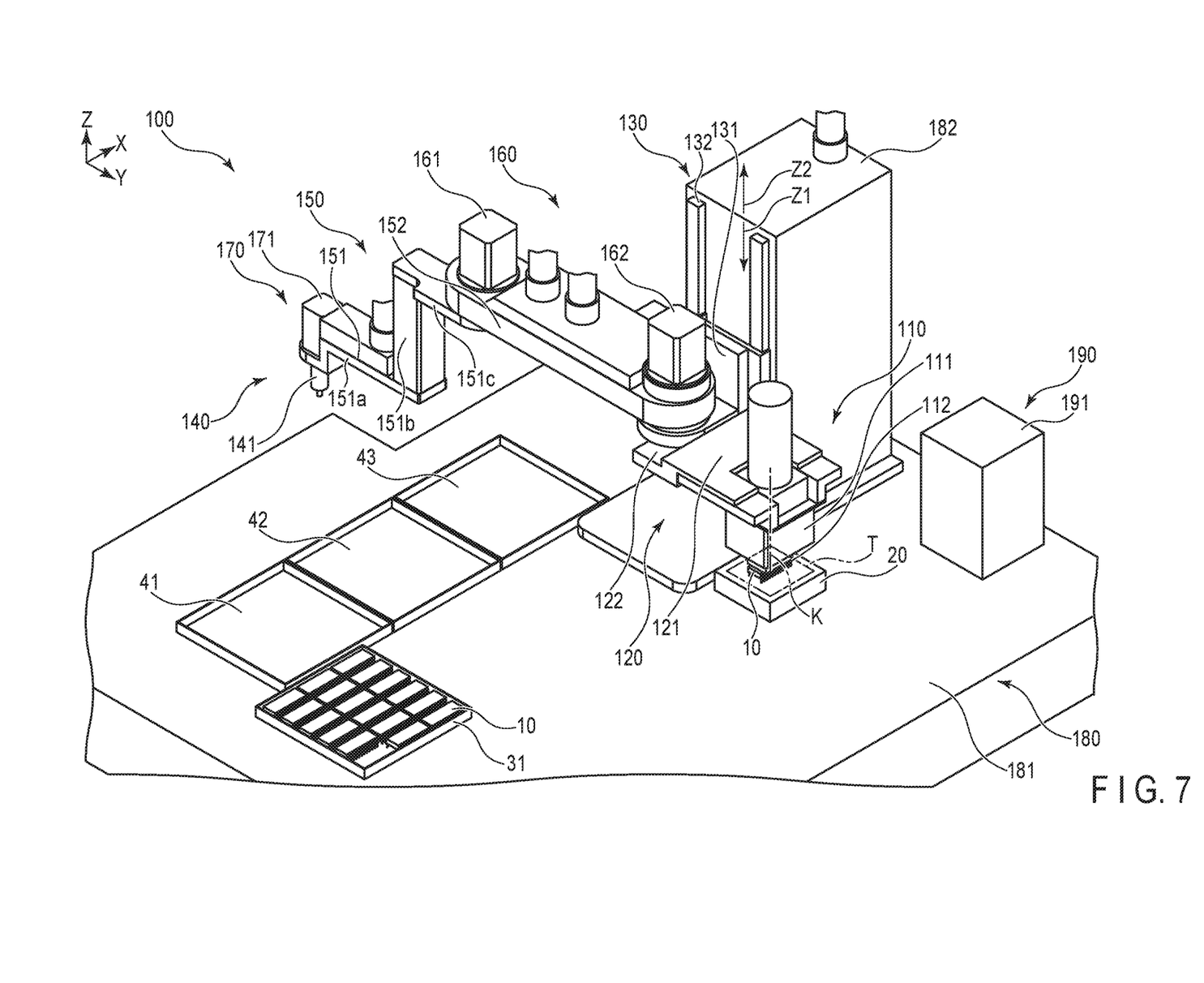
FIG. 7 is a perspective view showing the state in which the electrical properties of the IC chip are inspected subsequent to the states shown in FIG. 5 and FIG. 6.
Figure 8:
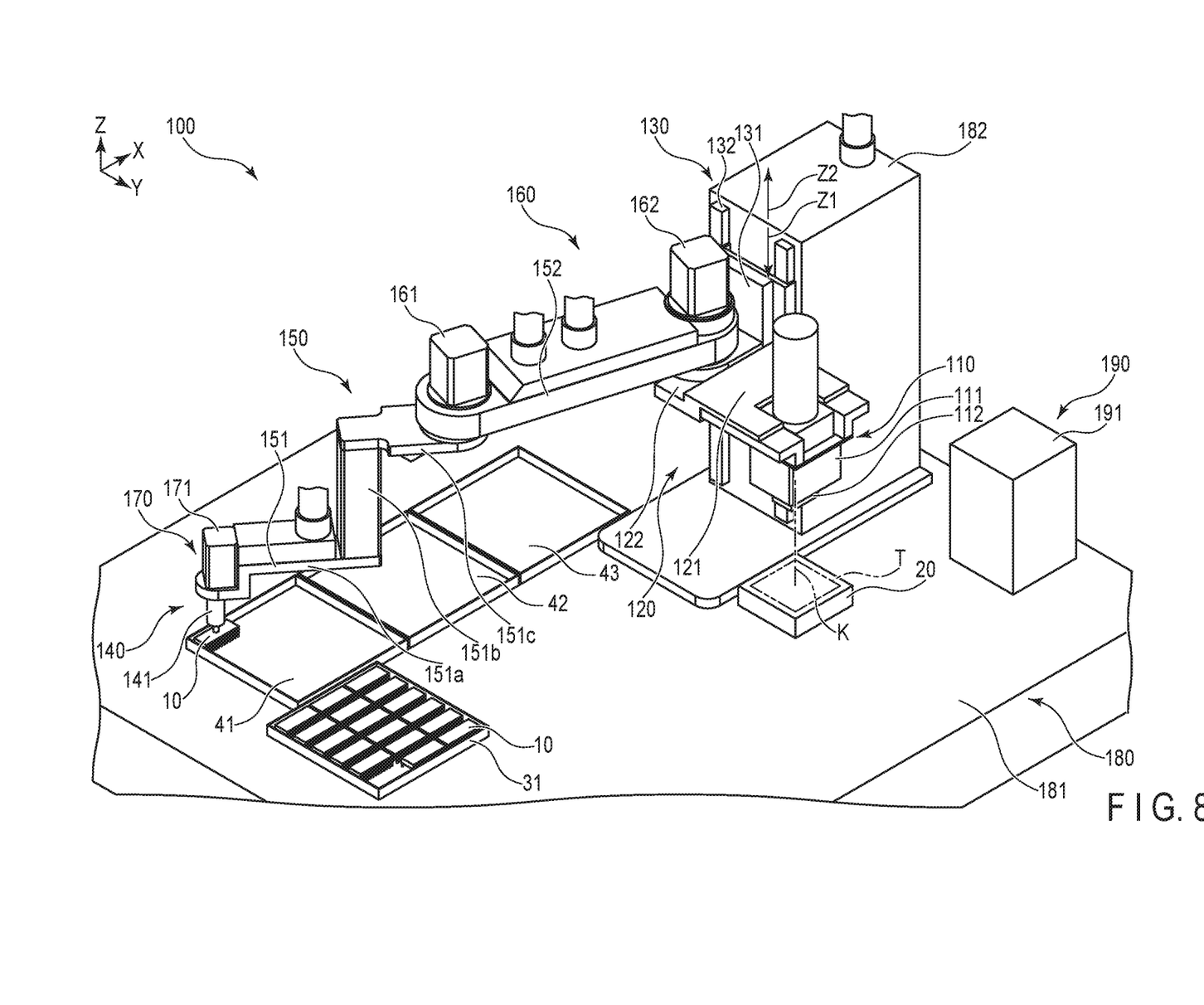
FIG. 8 is a perspective view showing the state in which the IC chip is sorted out and housed based on the result of inspection subsequent to the state shown in FIG. 7.

An example of the operation of the IC handler 100 is explained with reference to FIG. 4 to FIG. 8. FIG. 4 is a perspective view showing the state in which an IC chip 10 is taken out from the feed tray 31 regarding the operation of the IC handler 100 according to the embodiment. FIG. 5 is a perspective view showing the state in which the IC chip 10 is placed in the socket 20 subsequent to the state shown in FIG. 4. FIG. 6 is a front view showing the main part of the state of FIG. 5. FIG. 7 is a perspective view showing the state in which the electrical properties of the IC chip 10 are inspected subsequent to the states shown in FIG. 5 and FIG. 6. FIG. 8 is a perspective view showing the state in which the IC chip 10 is sorted out and housed based on the result of inspection subsequent to the state shown in FIG. 7.

First, as shown in FIG. 4, an IC chip 10 is taken out (picked out) from the feed tray 31. Specifically, the pick up tip 141 is caused to be located above the IC chip 10 housed in the feed tray 31 when the first motor 161 rotates the first arm 151 and the second motor 162 rotates the first arm 151 and the second arm 152. At the same time as the above operation or after the above operation, the first driving unit 130 causes the pick up tip 141 to descend and come in contact with the IC chip 10. Subsequently, the pick up tip 141 picks up and holds the IC chip 10.

Subsequently, as shown in FIG. 5 and FIG. 6, the IC chip 10 is placed in the socket 20. Specifically, the first driving unit 130 causes the pick up tip 141 to ascend subsequent to the state shown in FIG. 4. The first motor 161 rotates the first arm 151, and the second motor 162 rotates the first arm 151 and the second arm 152. Further, the third motor 171 rotates the IC chip 10 and adjusts the angle. In this way, the pick up tip 141 holding the IC chip 10 is located above the socket 20. At the same time as the above operation or after the above operation, the first driving unit 130 causes the pick up tip 141 to descend to set the IC chip 10 in the socket 20. The adsorption of the IC chip 10 by the pick up tip 141 is stopped. The pick up tip 141 is moved away from the upper side of the socket 20.

Here, the above states shown in FIG. 5 and FIG. 6 are equivalent to the state of a first posture in which the pick up tip 141 is located inside the movement path K, and further, the second portion 151b is located outside the movement path K so as to face the contactor 110. At the time of the first posture, in addition to the pick up tip 141, the first portion 151a is located inside the movement path K. In other words, the first arm 151 of the crank unit 150 prevents interference with the contactor 110 by rotating to the lower side of the contactor 110. Further, at the time of the first posture, the second portion 151b faces a side surface of the contactor 110.

Subsequently, as shown in FIG. 7, the electrical properties of the IC chip 10 are inspected. Specifically, subsequent to the states shown in FIG. 5 and FIG. 6, the first driving unit 130 causes the contactor 110 to descend to press the temperature adjustment unit 112 against the IC chip 10. Subsequently, the socket 20 supplies power to the IC chip 10 while picking up the IC chip 10. The temperature adjustment unit 112 adjusts the temperature of the IC chip 10 so as to be a predetermined temperature. In the above state, the inspection unit 111 inputs a signal to the IC chip 10 and inspects the electrical properties. After the inspection of the IC chip 10 is completed, the socket 20 stops the adsorption of the IC chip 10 and the supply of drive power, and further, the temperature adjustment unit 112 stops the adjustment of the temperature of the IC chip 10.

The above state shown in FIG. 7 is equivalent to the state of a second posture in which the contactor 110 is located in the vicinity of the IC chip 10 provided in the placement area T. The contactor 110 presses the IC chip 10. In the second posture, the pick up tip 141 is located outside the movement path K.

Lastly, as shown in FIG. 8, the IC chip 10 is sorted out and housed based on the result of inspection. Specifically, subsequent to the state shown in FIG. 7, the contactor 110 ascends and is moved away from the IC chip 10. Subsequently, the pick up tip 141 picks up and holds the IC chip 10. Based on the result of inspection of the IC chip 10, the pick up tip 141 moves, sorts out the IC chip 10 and puts the IC chip 10 in the OK-device tray 41, the reinspection-device tray 42 or the NG-device tray 43.

The action and effect of the IC handler 100 of the embodiment are explained with reference to FIG. 5 to FIG. 7.

The IC handler 100 of the present embodiment is allowed to be in the first posture (FIG. 5 and FIG. 6) in which the pick up tip 141 attached to the first portion 151a is located inside the movement path K, and further, the second portion 151*b* of the crank unit 150 is located outside the movement path K so as to face the contactor 110. The IC handler 100 of the present embodiment is also allowed to be in the second posture (FIG. 7) in which the contactor 110 is located in the vicinity of the IC chip 10 provided in the placement area T to press the IC chip 10. The first portion 151*a* extends in a direction intersecting with the perpendicular direction Z. The second portion 151*b* connected to the first portion 151*a* extends from the position connected to the first portion 151*a* to a side separating from the placement area T in a direction (perpendicular direction Z) parallel to the movement path K (in other words, extends to the upper side Z2 of the perpendicular direction Z). This structure can prevent interference between the crank unit 150 to which the pick up tip 141 is attached and the contactor 110 in a state where the pick up tip 141 is located inside the movement path K of the contactor 110. In this way, it is unnecessary to move the device (crank unit 150) to which the pick up tip 141 is attached in a plurality of directions to prevent interference with the contactor 110 when the pick up tip 141 is caused to be located inside the movement path K. Thus, the IC handler 100 can be simply structured.

The IC handler 100 of the present embodiment causes the pick up tip 141 to be located outside the movement path K of the contactor 110 in the second posture (FIG. 7). This structure can prevent interference between the contactor 110 and the pick up tip 141 and cause the contactor 110 to be located in the vicinity of the IC chip 10 (in other words, to be pressed against the IC chip 10). In a structure in which there is no problem even if the contactor 110 interferes with the pick up tip 141, the pick up tip 141 may be located inside the movement path K of the contactor 110 in the second posture. In a structure in which a process is performed in a state where the contactor 110 is in contact with the pick up tip 141, the pick up tip 141 is caused to be located inside the movement path K of the contactor 110 in the second posture.

The IC handler 100 of the present embodiment causes the first portion 151*a* of the crank unit 150 to be located inside the movement path K in addition to the pick up tip 141 in the first posture (FIG. 5 and FIG. 6). According to this structure, the pick up tip 141 can be moved in a state where the pick up tip 141 is sufficiently supported by the first portion 151*a* of the crank unit 150. Specifically, for example, in a structure in which the pick up tip 141 is attached to the lower side or upper side of the first portion 151*a* extending in a direction intersecting with the perpendicular direction Z, the pick up tip 141 can be sufficiently supported and fixed by the first portion 151*a* in comparison with a structure in which the pick up tip 141 is attached to a side surface of the first portion. In this case, the first portion 151*a* overlaps the pick up tip 141 in the perpendicular direction Z. Thus, the first portion 151*a* is located inside the movement path K in addition to the first portion 151*a*.

In the IC handler 100 of the present embodiment, the first driving unit 130 moves the crank unit 150 and the second driving unit 160 as well as the contactor 110. This structure can reduce the number of driving units in comparison with a structure in which the crank unit 150 and the second driving unit 160 are moved by a driving unit independent from the first driving unit 130. Thus, the IC handler 100 can be structured relatively at low cost and relatively downsized.

The IC handler of the present embodiment moves the pick up tip 141 by rotating the first arm 151 in a direction intersecting with the perpendicular direction Z with respect to the second arm with the first motor 161 and further by rotating the first arm 151 and the second arm 152 in a direction intersecting with the perpendicular direction Z with respect to the first driving unit 130 with the second motor 162. According to this structure, the pick up tip 141 can be easily moved to an arbitrary position defined by the lateral width direction X and the depth direction Y in a direction intersecting with the perpendicular direction Z. Thus, the IC handler 100 is allowed to easily transfer the IC chip 10 to an arbitrary position.

The IC handler 100 of the present embodiment comprises the third motor 171 which rotates the pick up tip 141 in a direction intersecting with the perpendicular direction Z. According to this structure, the IC chip 10 held by the pick up tip 141 can be adjusted in a predetermined direction by the third motor 171. Thus, the IC handler 100 is allowed to adjust the IC chip 10 in a predetermined direction and place the IC chip 10 in the placement area T. Moreover, the IC handler 100 is allowed to adjust the IC chip 10 in a predetermined direction and put the IC chip 10 in a container (the OK-device tray 41, the reinspection-device tray 42 and the NG-device tray 43).

In the IC handler 100 of the present embodiment, the contactor 110 comes in contact with (in other words, is pressed against) an IC chip 10 and processes the IC chip 10. Thus, the IC handler 100 is allowed to perform a process such as the inspection of the electrical properties of an IC chip 10 in a state where the contactor 110 is pressed against the IC chip 10 while preventing interference with the pick up tip 141 holding the IC chip 10.

The IC handler 100 of the present embodiment is allowed to transfer and process an IC chip 10 by the three-axial driving mechanism of the first driving unit 130 (Z-axial linear motion stage), the first motor 161 (θ-axial rotational stage) and the second motor 162 (θ-axial rotational stage). The IC handler 100 is also allowed to transfer and process an IC chip 10 while adjusting the direction of the IC chip 10 by a four-axial driving mechanism in which the third motor (θ-axial rotational stage) is added to the above three-axial driving mechanism. In this case, it is unnecessary to separately provide a structure for rotating an IC chip 10 in a predetermined direction. Thus, the IC handler of the present embodiment can be realized by a simple structure using a driving mechanism in which the number of axes is less (3 axes or 4 axes) in comparison with a common IC handler. Since the IC handler 100 is allowed to transfer an IC chip 10 in the movement range R which is sufficiently wide as shown in FIG. 2, the degree of freedom of the positions at which various trays (the feed tray 31, the OK-device tray 41, the reinspection-device tray 42 and the NG-device tray 43) are placed is high. As a result, the IC handler 100 can be structured so as to have a less number of components and be compact at low cost while sufficiently satisfying the common performance. The IC handler 100 can prevent a failure with a simple structure in which the number of components is less.

The IC handler 100 of the present embodiment transfers an IC chip 10 to the socket 20 located under the contactor 110 in a state where the IC chip 10 is picked up by the pick up tip 141. Thus, the contactor 110 does not need a structure for picking up the IC chip 10. As a result, for example, the contactor 110 is allowed to cause the temperature adjustment unit 112 to directly come in contact with the IC chip 10. In this way, the temperature of the IC chip 10 can be adjusted with high accuracy by the temperature adjustment unit 112.

In the IC handler 100 of the present embodiment, the contactor 110 is attached to the first driving unit 130 having high rigidity via the supporting unit 120. Thus, for example, the IC handler 100 is allowed to apply a relatively large load to an IC chip 10 by using the contactor 110. The IC handler 100 is allowed to accurately inspect the electrical properties of the IC chip 10 in a state where a terminal of the IC chip 10 is sufficiently in contact with a terminal of the socket 20, and a terminal of the IC chip 10 is sufficiently in contact with a terminal of the inspection unit 111.

In the IC handler 100 of the present embodiment, the contactor 110 is provided in the first driving unit 130 via the supporting unit 120, and further, the pick up tip 141 is provided in the first driving unit 130 via the supporting unit 120, the crank unit 150, etc. In this structure, the distance between the contactor 110 and the pick up tip 141 is set in a certain range. Thus, it is unnecessary to use, for example, a relay mechanism (relay shuttle) for long-distance transfer for the transfer of an IC chip 10.

The IC handler 100 of the present embodiment is configured to use an encoder as well as a speed reducer for each of the first motor 161 and the second motor 162 of the second driving unit 160. In this structure, the first arm 151 and the second arm 152 of the crank unit 150 can be rotated with high resolution while maintaining angular transmission accuracy. Thus, the IC handler 100 is allowed to transfer an IC chip 10 with high positioning accuracy.

When the present invention is implemented, the above embodiment is merely an example, and specific forms may be modified in various ways.

The handler of the present invention is explained so as to have a structure in which the inspection unit 111 and the temperature adjustment unit 112 are provided in the contactor (processing unit) 110. The handler of the present invention is not limited to the above structure, and may have a structure in which an inspection unit and a temperature adjustment unit are provided in the socket 20. In other words, the processing unit may be configured to perform only a process for pressing an IC chip 10 against the socket 20.

For example, the handler of the present invention is explained as the IC handler 100 which inspects the electrical properties of an IC chip 10 which is a device equivalent to an electronic component. The handler of the present invention is not limited to the above structure, and for example, may be structured as a lathe for metal processing. Specifically, the handler of the present invention may be configured to apply cutting processing to, for example, a member formed of a metal material, with, for example, an end mill provided in the contactor 110.

The handler of the present invention may be structured as, for example, a three-dimensional optical printer. Specifically, the handler of the present invention may be configured to selectively input light or heat to a powder member formed of photo-curable resin or thermosetting resin with a laser oscillator provided in the contactor 110 to cure and change the powder member so as to have an arbitrary shape.

The handler 100 of the present invention may be configured to process a device held by the holding unit 140 with the contactor (processing unit) 110.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A handler comprising:
    a processing unit which processes a device provided in a placement area;
    a first driving unit which moves the processing unit along a movement path reaching the placement area;
    a holding unit allowed to hold the device;
    a crank unit to which the holding unit is attached; and
    a second driving unit which moves the holding unit so as to be inside the movement path via the crank unit, wherein
    the crank unit including:
        a first portion to which the holding unit is attached and which extends in a direction intersecting with a direction parallel to the movement path; and
        a second portion connected to the first portion and extending from a position connected to the first portion to a side separating from the placement area in the direction parallel to the movement path, and
    the handler is allowed to be in a first posture for causing the holding unit to be located inside the movement path and causing the second portion to be located outside the movement path so as to face the processing unit, and
    the handler is allowed to be in a second posture for causing the processing unit to be located in vicinity of the device provided in the placement area.

2. The handler of claim 1, wherein
in the second posture, the holding unit is caused to be located outside the movement path.

3. The handler of claim 1, wherein
in the first posture, in addition to the holding unit, the first portion is caused to be located inside the movement path.

4. The handler of claim 1, wherein
the first driving unit moves the crank unit and the second driving unit as well as the processing unit.

5. The handler of claim 1, wherein
the crank unit comprises:
    a first arm including the first portion and the second portion; and
    a second arm connected to the first arm, and
the second driving unit comprises:
    a first motor which rotates the first arm in a direction intersecting with the direction parallel to the movement path with respect to the second arm; and
    a second motor which rotates the second arm in a direction intersecting with the direction parallel to the movement path with respect to the first driving unit.

6. The handler of claim 1, further comprising a third motor which rotates the holding unit in a direction intersecting with the direction parallel to the movement path.

7. The handler of claim 1, wherein
the processing unit comes in contact with the device and processes the device.

* * * * *